United States Patent [19]
Tamamura et al.

[11] Patent Number: 6,084,251
[45] Date of Patent: Jul. 4, 2000

[54] SEMICONDUCTOR LIGHT EMITTING DEVICE WITH CARRIER DIFFUSION SUPPRESSING LAYER

[75] Inventors: Koshi Tamamura, Tokyo; Takayuki Kawasumi; Shoji Hirata, both of Kanagawa, all of Japan

[73] Assignee: Sony Corporation, Tokyo, Japan

[21] Appl. No.: 09/014,683

[22] Filed: Jan. 28, 1998

[30] Foreign Application Priority Data

Jan. 30, 1997 [JP] Japan ................................. 9-016536

[51] Int. Cl.[7] .............................. H01L 33/00; H01S 3/18; H01S 3/19
[52] U.S. Cl. ................................ 257/94; 257/96; 372/43; 372/45; 372/46
[58] Field of Search .................. 257/200, 94, 96; 372/43, 45, 46

Primary Examiner—Steven H. Loke
Attorney, Agent, or Firm—Hill & Simpson

[57] ABSTRACT

Disclosed is a semiconductor light emitting device improved in static characteristics such as operational current and prolonged in service life. On an n-type GaAs substrate are sequentially grown an n-type GaAs buffer layer having a thickness of 0.3 $\mu$m; an n-type AlGaInP cladding layer having a thickness of 1 $\mu$m; and an active layer having a MQW structure of GaInP/AlGaInP. Then, a carrier diffusion suppressing layer having a thickness of 50 nm is grown on the active layer at a reduced V/III ratio. On the carrier diffusion suppressing layer are sequentially grown a p-type AlGaInP cladding layer having a thickness of 1 $\mu$m; a p-type GaInP layer having a thickness of 0.1 $\mu$m; and a p-type GaAs current cap layer having a thickness of 0.3 $\mu$m. Then, the p-type AlGaInP cladding layer, p-type GaInP layer, and p-type GaAs current cap layer are selectively etched by typically photolithography, to form a mesa structure, and an n-type GaAs current cap layer is grown to be laminated on both sides of the mesa structure, to form a semiconductor light emitting device.

28 Claims, 1 Drawing Sheet

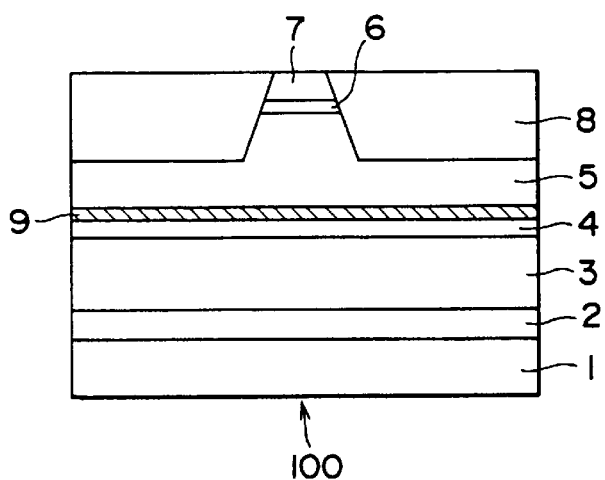
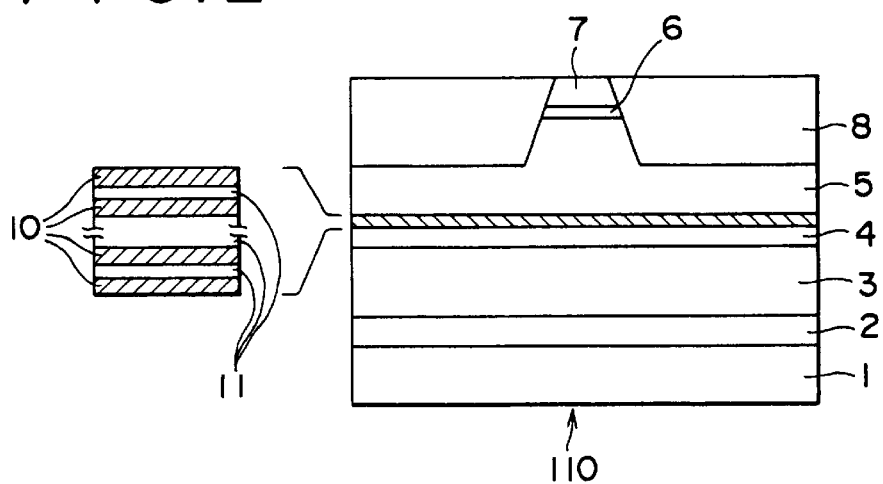
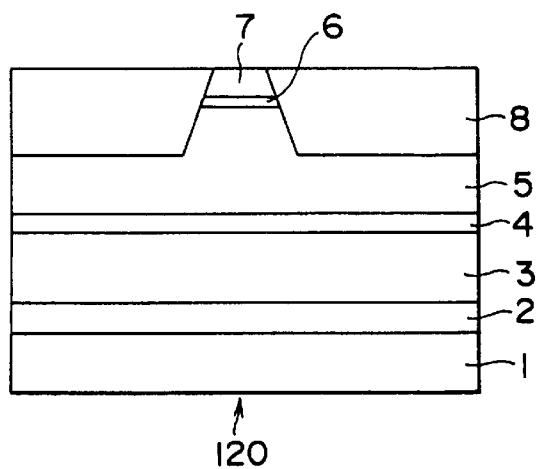

SEMICONDUCTOR LIGHT EMITTING DEVICE WITH CARRIER DIFFUSION SUPPRESSING LAYER

BACKGROUND OF THE INVENTION

The present invention relates to an AlGaInP based semiconductor light emitting device having a structure in which a first cladding layer, an active layer, and a second cladding layer are sequentially laminated.

With respect to AlGaInP based semiconductor light emitting devices represented by an AlGaInP based laser diode (LD) or light emitting diode (LED), recently, those each having a wavelength band centered at a wavelength shorter than 680 nm, typically, at 650 nm or 635 nm have come to be practically used.

As one example of the above semiconductor light emitting devices, a III–V compound based semiconductor light emitting device, particularly, an AlGaInP based semiconductor laser will be described with reference to FIG. 3.

FIG. 3 is a sectional view of a semiconductor laser 120 which is one example of a related art semiconductor light emitting device. The semiconductor laser is fabricated by a MOCVD (Metal Organic Chemical Vapor Deposition) process. Referring to FIG. 3, on a substrate 1 of a first conducting type, for example, on an n-type GaAs substrate 1 are sequentially grown an n-type (first conducting type) GaAs buffer layer 2 having a thickness of 0.3 µm; an n-type AlGaInP cladding layer 3 having a thickness of 1 µm; an active layer 4 having a MQW (Multi-Quantum Well) structure of GaInP/AlGaInP; a p-type (second conducting type) AlGaInP cladding layer 5 having a thickness of 1 µm; a p-type GaInP layer 6 having a thickness of 0.1 µm; and a p-type GaAs current cap layer 7 having a thickness of 0.3 µm.

The p-type AlGaInP cladding layer 5, p-type GaInP layer 6, and p-type GaAs current cap layer 7 are then selectively etched by typically photolithography, to form a mesa structure. Thereafter, an n-type GaAs current block layer 8 is grown to be laminated on both sides of the mesa structure, to form a semiconductor light emitting device 120.

With the recent extension of service environments of optical disks and the like, the semiconductor light emitting device 120 used as light sources of these optical disks and the like has been required to be improved in temperature characteristic, particularly, to be prolonged in service life under output operation of, for example, 30 mW at 80° C.

To meet the above requirement, there have been proposed a method of increasing a composition ratio of Al in the p-type AlGaInP cladding layer 5 for strengthening confinement of carriers and light in the active layer 4, and a method of laminating a multi-layer thin film structure called a MQB (Multi-Quantum Barrier) at a portion adjacent to the active layer 4.

Japanese Patent Laid-open No. Hei 6-237038 has proposed a method of suppressing diffusion of p-type carriers by provision of a multi-layer film structure in which AlGaInP layers having strain and being different in composition ratio of Al are laminated.

Further, it may be considered that a Fermi level is raised by increasing a concentration of carriers in the p-type cladding layer, to thus substantially strengthen the confinement effect of the active layer 4.

The above-described methods, however, have disadvantages. The growth of the MQB or the AlGaInP multi-layer film having strain needs strict setting of a film thickness and a composition ratio, and if actual film thickness and composition ratio are offset from the setting values upon growth of the above MQB or the AlGaInP multi-layer film, characteristics of the device is rather degraded. Also, while it is easy to increase the concentration of carriers in the p-type cladding layer, if the carriers are diffused up to the active layer 4, there may occur defects acting as dark defects or luminescence centers in the active layer, as a result of which static characteristics such as operational current of the semiconductor light emitting device 120 are degraded and also the service life is shortened by progress of diffusion of the carriers due to heat generation or current-carrying.

SUMMARY OF THE INVENTION

An object of the present invention is to provide a semiconductor light emitting device improved in static characteristics such as an operational current and prolonged in service life, which is fabricated by a method in which a concentration of carriers in a cladding layer is increased and diffusion of carriers onto an active layer side is suppressed.

To achieve the above object, according to one aspect of the present invention, there is provided a semiconductor light emitting device in which a cladding layer of a first conducting type, an active layer, and a cladding layer of a second conducting type are formed on a substrate, the semiconductor light emitting device including: a diffusion suppressing layer provided on at least one of sides where the cladding layers are provided; wherein each of said cladding layers is made from a III–V compound semiconductor and a supply ratio, V/III ratio between raw materials for growth of the diffusion suppressing layer is different from the V/III ratio between raw materials for growth of the cladding layer on the side where the diffusion suppressing layer is provided.

The diffusion suppressing layer may be made from the same material as that of the cladding layer on the side where the diffusion suppressing layer is provided.

Preferably, the diffusion suppressing layer is formed on the side where a p-type cladding layer is provided, and a supply ratio, V/III ratio between raw materials for growth of the diffusion suppressing layer is smaller than a V/III ratio between raw materials for growth of the p-type cladding layer; or the diffusion suppressing layer is formed on the side where an n-type cladding layer is provided, and a supply ratio, V/III ratio between raw materials for growth of the diffusion suppressing layer is smaller than a V/III ratio between raw materials for growth of the n-type cladding layer.

The diffusion suppressing layer may be undoped. A concentration of carriers in the diffusion suppressing layer is preferably smaller than a concentration of carriers in the cladding layers on the side where the diffusion suppressing layer is provided.

The diffusion suppressing layer may be provided adjacently to the active layer. The diffusion suppressing layer can be separated from the active layer. In this case, preferably, the distance between the diffusion suppressing layer and the active layer is set at 30 nm.

The diffusion suppressing layer, preferably, has a multi-layer structure of layers grown with a V/III ratio different from that for growth of the cladding layer on the side where the diffusion suppressing layer is provided and layers grown with the same V/III ratio as that for growth of the cladding layer.

The diffusion of carriers may sometimes occur in such a form that interstitial atoms are diffused, but it may generally occur in such a form that atoms substituted at lattice points are then substituted at vacancies. To be more specific, for a III–V compound semiconductor, if atoms of a group II element are taken as a dopant, the atoms are substituted at the site of a group III element as an acceptor. In this case, diffusion of the atoms occurs by substitution of the atoms at vacancies of the group III element. Similarly, atoms of each of a group VI or IV element are substituted at the site of the associated V or III element, and diffusion of the atoms occurs by substitution of the atoms at vacancies of the associated group V or III element.

In summary, to solve the above-described problems, the semiconductor light emitting device of the present invention has a structure in which at least a cladding layer of a first conducting type, an active layer, and a cladding layer of a second conducting type are formed on a substrate, wherein a carrier diffusion suppressing layer with smaller vacancies into which carries are to be substituted is grown on at least one of regions adjacent to the active layer by specifying a supply ratio between raw materials for forming the carrier diffusion suppressing layer. The carrier diffusion suppressing layer may be replaced with a multi-layer superlattice structure in which carrier diffusion layers and normal layers each being similar to one of the cladding layers are alternately laminated. In this case, the carrier diffusion layers are grown by specifying a supply ratio between raw materials under a condition capable of reducing point detects and the normal layers each being similar to one of the cladding layers are grown under a usual condition.

According to the AlGaInP based semiconductor light emitting device of the present invention, since the concentration of carriers in the cladding layer is increased, it is possible to improve the temperature characteristic, and since diffusion of the carriers into the active layer is suppressed, it is possible to prevent degradation in static characteristics such as operational current and shortening in service life.

BRIEF DESCRIPTION OF THE DRAWINGS

FIG. 1 is a schematic sectional view showing a first example of a semiconductor light emitting device of the present invention;

FIG. 2 is a schematic sectional view showing a second example of the semiconductor light emitting device of the present invention; and FIG. 3 is a schematic sectional view showing a related art semiconductor light emitting device.

DETAILED DESCRIPTION OF THE PREFERRED EMBODIMENT

Hereinafter, one preferred embodiment of the present invention will be described with reference to the accompanying drawings.

First, there will be described diffusion of atoms as a dopant. For example, in growth of AlGaInP as a III–V compound, atoms of a group II element such as zinc, magnesium, cadmium or beryllium are used as a p-type dopant. When these atoms as the p-type dopant are supplied at a large atomic concentration of, for example, about $5 \times 10^{19}$ cm$^{-3}$ upon growth of AlGaInP, part of the atoms may remain inactive, that is, not acting as carriers, or entrapped in AlGaInP as interstitial atoms.

Besides, in growth of a light emitting element, to form a cladding layer or the like other than a layer having a high carrier concentration such as a contact layer, atoms of a raw material are supplied at a carrier concentration of about $1 \times 10^{17} - 5 \times 10^{18}$ cm$^{-3}$. Accordingly, in some cases, inactive carriers are present; however, atoms as a dopant are generally substituted at lattice points. For example, atoms of the above-described group II element are substituted at the site of the group III element as an acceptor.

Similarly, for a III–V compound semiconductor, atoms of a group VI element such as selenium, sulfur, or tellurium are substituted at the site of a group V element as a donor; and atoms of a group IV element such as silicon, germanium or carbon are substituted at the site of a group III element as a donor, but they can be substituted at the site of the group V element as an acceptor. The above atoms of a group IV element are called an amphoteric impurity.

These atoms are diffused, on the basis of a diffusion coefficient, from a portion having a dense concentration to a portion having a thin concentration through defects by the effect of heat generation, current-carrying or strain. The defects have been regarded as dislocations; however, in the recent year, with the developed growth technology, it is found that the defects are mainly represented by point defects such as atomic vacancies. To reduce occurrence of these point defects, a perfect crystal may be grown under a growth condition of reducing point defects due to, for example, non-stoichiometric composition.

In growth of a III–V compound, since a vapor pressure for a group V element is generally high with the exception depending on the growth process, atoms of the group V element are liable to be partially eliminated from the grown crystal. For this reason, atoms of the group V element are supplied in a large amount as compared with atoms of a group III element, and accordingly, the grown crystal is slightly rich in atoms of the group V element.

In a III–V compound semiconductor, however, atoms of a group II element as p-type carriers tend to be easily diffused because a large number of vacancies of atoms of a group III element occur under this growth condition. As a result, from the viewpoint of only diffusion of carriers, by setting a V/III ratio, which is a supply ratio between raw materials of the group V element and the group III element, at a value smaller than that used for the usual growth condition, diffusion of the carriers can be made smaller.

Beside, growth of a carrier diffusion suppressing layer to a large thickness increases atomic vacancies of a group V element, and thereby it is inconvenient from the viewpoint of the perfect crystal. To cope with such an inconvenience, there may be formed a multi-layer structure in which thin carrier diffusion suppressing layers and thin layers grown under a usual growth condition are repeatedly laminated. The repeatedly laminated layers are the same in material but are different in crystal structure, to thus form a supperlattice structure.

The present invention will be more clearly understood with reference to the following examples in each of which the present invention is applied to a III–V compound semiconductor light emitting device, particularly, an AlGaInP based semiconductor laser.

EXAMPLE 1

FIG. 1 is a sectional view of a semiconductor laser as a first example of the present invention. The semiconductor laser is fabricated by MOCVD. In this example, on a substrate 1 of a first conducting type, for example, on an n-type GaAs substrate 1 are sequentially grown an n-type (first conducting type) GaAs buffer layer 2 having a thickness of 0.3 $\mu$m; an n-type AlGaInP cladding layer 3 having a thickness of 1 $\mu$m; and an active layer 4 having a MQW (Multi-Quantum Well) structure of GaInP/AlGaInP.

Then, a carrier diffusion suppressing layer 9 having a thickness of 50 nm is grown on the active layer 4 at a reduced V/III ratio. For example, while the V/III ratio for the usual cladding layer is set at 200, the V/III ratio for the carrier diffusion suppressing layer 9 is set at 100.

The growth condition will be described in detail below. In the case of forming the usual cladding layer, that is, in the case where the V/III ratio is set at 200, a flow rate of $PH_3$ as a source gas for phosphorus as a group V element is set at 300 cc/min; a flow rate of TMG (Trimethylgallium) as a source gas for gallium as a group III element is set at 6 cc/min; a flow rate of TMA (Trimethylaluminium) as a source gas for aluminum as a group III element is set at 30 cc/min; and a flow rate of TMI (Trimethylindium) as a source gas for indium as a group III element is set at 350 cc/min. That is, a mol ratio in flow rate between the group V element and the group III elements becomes 200:1. On the contrary, in the case where the V/III ratio is set at 100, that is, in the case of forming the carrier diffusion suppressing layer, the amount of $PH_3$ may be reduced to half, that is, 150 cc/min.

On the carrier diffusion suppressing layer 9 are sequentially grown a p-type (second conducting type) AlGaInP cladding layer 5 having a thickness of 1 µm; a p-type GaInP layer 6 having a thickness of 0.1 µm; and a p-type GaAs current cap layer 7 having a thickness of 0.3 µm.

The p-type AlGaInP cladding layer 5, p-type GaInP layer 6, and p-type GaAs current cap layer 7 are then selectively etched by typically photolithography, to form a mesa structure. Thereafter, an n-type GaAs current block layer 8 is grown to be laminated on both sides of the mesa structure, to form a semiconductor light emitting device 100.

EXAMPLE 2

FIG. 2 is a sectional view of a semiconductor laser as a second example of the present invention. The semiconductor laser is fabricated by MOCVD. In this example, on a substrate 1 of a first conducting type, for example, on an n-type GaAs substrate 1 are sequentially grown an n-type (first conducting type) GaAs buffer layer 2 having a thickness of 0.3 µm; an n-type AlGaInP cladding layer 3 having a thickness of 1 µm; and an active layer 4 having a MQW (Multi-Quantum Well) structure of GaInP/AlGaInP.

Then, a multi-layer structure for suppressing diffusion of carriers is formed on the active layer 4. To be more specifically, the multi-layer structure is formed by alternatively laminating carrier diffusion suppressing layers 10 (thickness: 5 nm for each layer) grown with a reduced V/III ratio and p-type AlGaInP layers 11 (thickness: 5 nm for each layer) grown with a usual V/III ratio.

On the carrier diffusion suppressing layer 10 are sequentially grown a p-type (second conducting type) AlGaInP cladding layer 5 having a thickness of 1 µm; a p-type GaInP layer 6 having a thickness of 0.1 µm; and a p-type GaAs current cap layer 7 having a thickness of 0.3 µm.

The p-type AlGaInP cladding layer 5, p-type GaInP layer 6, and p-type GaAs current cap layer 7 are then selectively etched by typically photolithography, to form a mesa structure. Thereafter, an n-type GaAs current block layer 8 is grown to be laminated on both sides of the mesa structure, to form a semiconductor light emitting device 110.

Each of the carrier diffusion suppressing layer 9 in Example 1 and the carrier diffusion suppressing layer 10 in Example 2 is undoped; however, it may be doped at a concentration of carriers lower than that for the cladding layer.

Each of the carrier diffusion suppressing layers 9 and 10 is formed on the side of the p-type AlGaInP cladding layer 5 of the second conducting type, it may be formed on the side of the n-type AlGaInP cladding layer 3 of the first conducting type with the active layer 4 put therebetween.

In Examples 1 and 2, each of the carrier diffusion suppressing layers 9 and 10 is provided at a portion adjacent to the active layer 4; however, it may be provided at a portion separated a distance of, for example, about 30 nm from the active layer 4.

In Examples 1 and 2, the first conducting type is taken as n-type and the second conducting type is taken as p-type; however, the first conducting type may be taken as p-type and the second conducting type be taken as an n-type.

Although the present invention has been described using Examples 1 and 2, such description is for illustrative purposes only, and it is to be understood that many changes and variations may be made without departing from the spirit or scope of the following claims.

What is claimed is:

1. A semiconductor light emitting device in which a cladding layer of a first conducting type, an active layer, and a cladding layer of a second conducting type are formed on a substrate with said active layer positioned between said first and second cladding layers, said semiconductor light emitting device comprising:

a diffusion suppressing layer provided on one side of said active layer;

wherein each of said cladding layers is made from a III–V compound semiconductor; and a supply ratio of group V to group III raw materials for growth of said diffusion suppressing layer is different than a supply ratio of group V to group III raw materials for growth of said cladding layer on the side of the active layer where said diffusion suppressing layer is provided.

2. A semiconductor light emitting device according to claim 1, wherein said diffusion suppressing layer is made from the same material as that of said cladding layer on the side where said diffusion suppressing layer is provided.

3. A semiconductor light emitting device according to claim 1, wherein said diffusion suppressing layer is formed on the side where a p-type cladding layer is provided, and the supply ratio for raw materials for growth of said diffusion suppressing layer is smaller than the supply ratio for raw materials for growth of said p-type cladding layer.

4. A semiconductor light emitting device according to claim 1, wherein said diffusion suppressing layer is formed on the side where an n-type cladding layer is provided, and the supply ratio for raw materials for growth of said diffusion suppressing layer is smaller than the supply ratio for raw materials for growth of said n-type cladding layer.

5. A semiconductor light emitting device according to claim 1, wherein said diffusion suppressing layer is undoped.

6. A semiconductor light emitting device according to claim 1, wherein a concentration of carriers in said diffusion suppressing layer is smaller than a concentration of carriers in said cladding layer positioned on the same side of said active layer where said diffusion suppressing layer is provided.

7. A semiconductor light emitting device according to claim 1, wherein said diffusion suppressing layer is provided adjacently to said active layer.

8. A semiconductor light emitting device according to claim 1, wherein said diffusion suppressing layer is separated from said active layer.

9. A semiconductor light emitting device according to claim 8, wherein the distance between said diffusion suppressing layer and said active layer is 30 nm.

10. A semiconductor light emitting device accordingly to claim 1, wherein said diffusion suppressing layer has a multi-layer structure of layers grown with a supply ratio different than that for growth of said cladding layer on the side where said diffusion suppressing layer is provided and alternate layers of the multi-layer structure are grown with the same supply ratio as that for growth of said cladding layer.

11. A semiconductor light emitting device comprising:
a first cladding layer of a first conductivity type;
a second cladding layer of a second conductivity type opposite that of the first cladding layer;
an active layer between said first and second cladding layers;
a carrier diffusion suppressing layer between said active layer and said second cladding layer, said second cladding layer and said carrier diffusion suppressing layer having vacancies into which second conductivity type carriers are to be diffused, said carrier diffusion layer having smaller vacancies than said second cladding layer;
wherein,
said carrier diffusion suppressing layer is made of a III–V semiconductor compound whose group III and group V materials are supplied in a first ratio of group V to group III materials,
said second cladding layer is made of a III–V semiconductor compound whose group III and group V materials are supplied in a second ratio of group V to group III materials, said second ratio being different than said first ratio.

12. The semiconductor light emitting device of claim 11, wherein said group III and group V materials are the same for the second cladding layer and the carrier diffusion suppressing layer.

13. The semiconductor light emitting device of claim 11, wherein the second ratio is greater than the first ratio.

14. The semiconductor light emitting device of claim 11, wherein the second cladding layer and said carrier diffusion suppressing layer are p-type layers and the second ratio is greater than the first ratio.

15. The semiconductor light emitting device of claim 11 wherein the carrier diffusion suppressing layer is not doped.

16. The semiconductor light emitting device of claim 11 wherein the carrier diffusion suppressing layer is adjacent the active layer.

17. The semiconductor light emitting device of claim 11 wherein said carrier diffusion suppressing layer is a superlattice structure layer comprising alternately laminated first and second layers, the first layers characterized by group III and group V materials supplied in said first ratio, the second layers characterized by group III and group V materials supplied in said second ratio.

18. The semiconductor light emitting device of claim 11 wherein the second cladding layer has a mesa structure and current block layers on opposite sides of the mesa structure.

19. The semiconductor light emitting device of claim 11 wherein the second cladding layer and said carrier diffusion suppressing layer are n-type layers.

20. The semiconductor light emitting device of claim 11 wherein a concentration of second conductivity type carriers in the carrier diffusion suppressing layer is smaller than a concentration of second conductivity type carriers in the second cladding layer.

21. The semiconductor light emitting device of claim 11 wherein the carrier diffusion suppressing layer and active layer are spaced apart from each other by a distance about 30 nm.

22. A semiconductor light emitting device, comprising:
a first AlGaInP cladding layer of a first conductivity type;
a second AlGaInP cladding layer of a second conductivity type opposite that of the first cladding layer;
a multi quantum well GaInP/AlGaInP active layer between said first and second cladding layers;
a carrier diffusion suppressing layer between said active layer and said second cladding layer, said carrier diffusion suppressing layer having vacancies of atoms of a group III element into which carriers are to be diffused smaller than those of said second cladding layer, said carrier diffusion suppressing layer being an AlGaInP layer of said second conductivity type;
wherein,
said carrier diffusion suppressing layer is made of group III and group V materials supplied in a first ratio of group V to group III materials,
said second cladding layer is made of said group III and group V materials supplied in a second ratio of group V to group III materials, said second ratio being different than said first ratio.

23. The semiconductor light emitting device of claim 22 wherein said first cladding layer is an n-type layer and said second cladding and carrier diffusion suppressing layers are p-type layers.

24. The semiconductor light emitting device of claim 22 wherein said first cladding layer is a p-type layer and said second cladding and carrier diffusion suppressing layers are n-type layers.

25. The semiconductor light emitting device of claim 22 wherein said carrier diffusion suppressing and second cladding layers are adjacent to each other.

26. The semiconductor light emitting device of claim 22 wherein said carrier diffusion suppressing layer and saidactive layer are spaced apart from each other by a distance of about 30 nm.

27. The semiconductor light emitting device of claim 22 wherein said first ratio is smaller than said second ratio.

28. The semiconductor light emitting device of claim 22 wherein said carrier diffusion suppressing layer is a superlattice structure layer.

* * * * *